United States Patent
Kim

(10) Patent No.: US 7,059,848 B2
(45) Date of Patent: Jun. 13, 2006

(54) METHOD OF AND AUXILIARY CLEANER FOR USE IN CLEANING A DIFFUSION FURNACE OF SEMICONDUCTOR MANUFACTURING EQUIPMENT

(75) Inventor: Jung-Nam Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/197,346

(22) Filed: Aug. 5, 2005

(65) Prior Publication Data

US 2006/0084023 A1 Apr. 20, 2006

(30) Foreign Application Priority Data

Oct. 18, 2004 (KR) ............... 10-2004-0083321

(51) Int. Cl.
*F27B 5/04* (2006.01)

(52) U.S. Cl. .................. 432/205; 432/2; 15/304; 15/406

(58) Field of Classification Search .......... 432/2, 432/205, 248, 251, 264, 224, 50; 15/301, 15/304, 406, 316.1; 134/22.1, 22.18, 24, 134/34, 37
See application file for complete search history.

(56) References Cited

U.S. PATENT DOCUMENTS 5,851,307 A * 12/1998 Gilmer et al. ............. 134/22.1
6,248,177 B1 * 6/2001 Halbmaier .................... 134/2
6,461,442 B1 * 10/2002 Bush et al. .................... 134/8

FOREIGN PATENT DOCUMENTS

JP      06-129214    5/1993
KR      1997-0063635  9/1997

* cited by examiner

*Primary Examiner*—Gregory Wilson
(74) *Attorney, Agent, or Firm*—Volentine Francos & Whitt, PLLC

(57) ABSTRACT

A diffusion furnace of semiconductor manufacturing equipment is cleaned efficiently with a cleaning gas ($ClF_3$) by using an auxiliary cleaner. The auxiliary cleaner is inserted into an inner tube of the wafer diffusion furnace. The auxiliary cleaner has a cylindrical body that occupies a central region of the interior of the furnace but is spaced apart from an inner wall surface of the inner tube. Accordingly, the gas is confined to a peripheral region adjacent the inner wall surface. As a result, a relatively small amount of the cleaning gas is comsumed during the cleaning process.

20 Claims, 5 Drawing Sheets

METHOD OF AND AUXILIARY CLEANER FOR USE IN CLEANING A DIFFUSION FURNACE OF SEMICONDUCTOR MANUFACTURING EQUIPMENT

BACKGROUND OF THE INVENTION

1. Field of the Invention

The present invention relates to a method of cleaning a diffusion furnace of semiconductor manufacturing equipment and to an auxiliary cleaner for cleaning the same. More particularly, the present invention relates to a method of and an auxiliary cleaner for cleaning a diffusion furnace of semiconductor manufacturing equipment using $ClF_3$ gas.

2. Description of the Related Art

In general, semiconductor devices are manufactured by selectively and repeatedly performing processes, such as photolithography, etching, diffusion, chemical vapor deposition, ion implantation, and metal deposition processes, on a wafer. The diffusion process is performed frequently among the aforementioned processes to diffuse desired conductive impurities into the wafer.

The diffusion process is performed in a diffusion furnace at a high temperature. In addition, the diffusion furnace may be used to form a thermal oxide layer on a wafer at about 900° C. or higher, to form an $SiO_2$ layer on a wafer using $SiH_4$ gas, to form a thin polysilicon layer on a wafer, and to perform annealing and baking processes, or the like.

In particular, the thin polysilicon layer-forming process is carried out using $SiH_4+PH_3$ gas. In this process, material is continuously deposited on interior parts of the diffusion furnace, thereby forming an undesirable membrane on the inside of the furnace. The membrane flakes off of or lifts from the interior parts of the furnace once it attains a certain thickness. As a result, the quality of the thin layer being formed on the surface of the wafer may be diminished.

Therefore, the membrane is periodically removed from the inner parts of the diffusion furnace using $ClF_3$ gas is used. That is, $ClF_3$ gas is injected into the diffusion furnace to remove the deposits from the interior parts of the diffusion furnace.

FIG. 1 schematically illustrates a conventional process of removing a membrane formed in a diffusion furnace. The diffusion furnace 100 includes an outer tube 110 exposed to the ambient outside the furnace, and an inner tube 112 located in the outer tube 110. A supply pipe 114 and a discharge pipe 116 for injecting and discharging $ClF_3$ gas into/from the diffusion furnace 100 are mounted at the lower part of the diffusion furnace 100. In addition, a support plate 118 is disposed at the bottom of the furnace 100 to support a wafer boat 120 in which the wafer is seated.

As shown in FIG. 2, the wafer boat 120 has three annular plates 122a, 122b and 122c supported in parallel by three rods 126 such that a hole 124 extends through the center of the boat 120. The diffusion furnace 100 is cleaned while the boat 120 is disposed in the diffusion furnace 100 in an attempt to direct the injected $ClF_3$ gas toward the inner wall of the inner tube 112 and out of the central region of the furnace.

However, as shown in FIG. 2, the structure of the wafer boat 120 is mostly open to allow the wafer to be loaded onto the boat 120. Accordingly, most of the $ClF_3$ gas passes through the boat 120, especially through the hole 124 defined by the center of the annular plates 122a, 122b and 122c. As a result, the $ClF_3$ gas can remain at the center of the furnace, i.e., the boat 120 does little to induce the $ClF_3$ gas to flow towards the inner wall of the inner tube 112. In addition, the $ClF_3$ gas flows rapidly throughout the interior of the furnace. Accordingly, the furnace is not cleaned efficiently, i.e., a large amount of the $ClF_3$ is consumed during the cleaning process.

SUMMARY OF THE INVENTION

An object of the present invention is to provide an efficient method of cleaning a diffusion furnace of semiconductor manufacturing equipment, i.e., a method which can be carried out in a short period of time and/or which requires only a small amount of cleaning gas.

Likewise, another embodiment of the present invention is to provide a dedicated auxiliary cleaner that will enhance the cleaning of a diffusion furnace of semiconductor manufacturing equipment using cleaning gas.

According to one aspect, the present invention provides an auxiliary cleaner characterized by a body that can be inserted into an inner tube of the wafer diffusion furnace as spaced apart from an inner wall surface of the inner tube.

The body of the auxiliary cleaner may have various cylindrical forms and is preferably in the form of a circular cylinder, i.e., preferably has the same general shape as the inner tube of the diffusion furnace. Also, the auxiliary cleaner may be hollow so as to be lightweight and economical to manufacture. Preferably, the body will occupy a greater volume than the wafer boat such that less cleaning gas is required to fill the furnace.

Also, preferably, a flange having an outer diameter larger than that of the body of the auxiliary cleaner is disposed at one end of the auxiliary cleaner so as to protrude radially outwardly therefrom. The flange inhibits the cleaning gas from moving upwardly to the top of the diffusion furnace, thereby also enhancing the efficiency of the cleaning process. The flange may be sized to contact the inner wall surface of the inner tube.

In addition, the outer surface of the body of the auxiliary cleaner may have undulations to impart turbulence to the cleaning gas. For instance, the outer surface of the body of the auxiliary cleaner may have a plurality of projections that will protrude towards the inner tube of the furnace. As a result, the cleaning gas passing between the outer surface of the auxiliary cleaner and the inner wall surface of the inner tube will become turbulent. Thus, the cleaning process will be enhanced. Alternatively, a groove may extend in the outer surface of the body of the auxiliary cleaner to impart turbulence to the cleaning gas. Preferably, the groove extends helically along the body of the auxiliary cleaner.

According to another aspect of the present invention, the auxiliary cleaner is inserted into the inner tube of the diffusion furnace, and cleaning gas is injected into the inner tube to clean the diffusion furnace. Thus, the volume of space within the inner tube of the diffusion furnace is reduced. Hence, the cleaning gas is concentrated along the inner wall surface of the inner tube to remove a membrane formed on the inner wall surface due to the diffusion process.

BRIEF DESCRIPTION OF THE DRAWINGS

The foregoing and other objects, features and advantages of the invention will be apparent from the detailed description of the preferred embodiments of the invention made with reference to the accompanying drawings, wherein.

DETAILED DESCRPTION OF THE PREFERRED EMBODIMENTS

Figure 1:
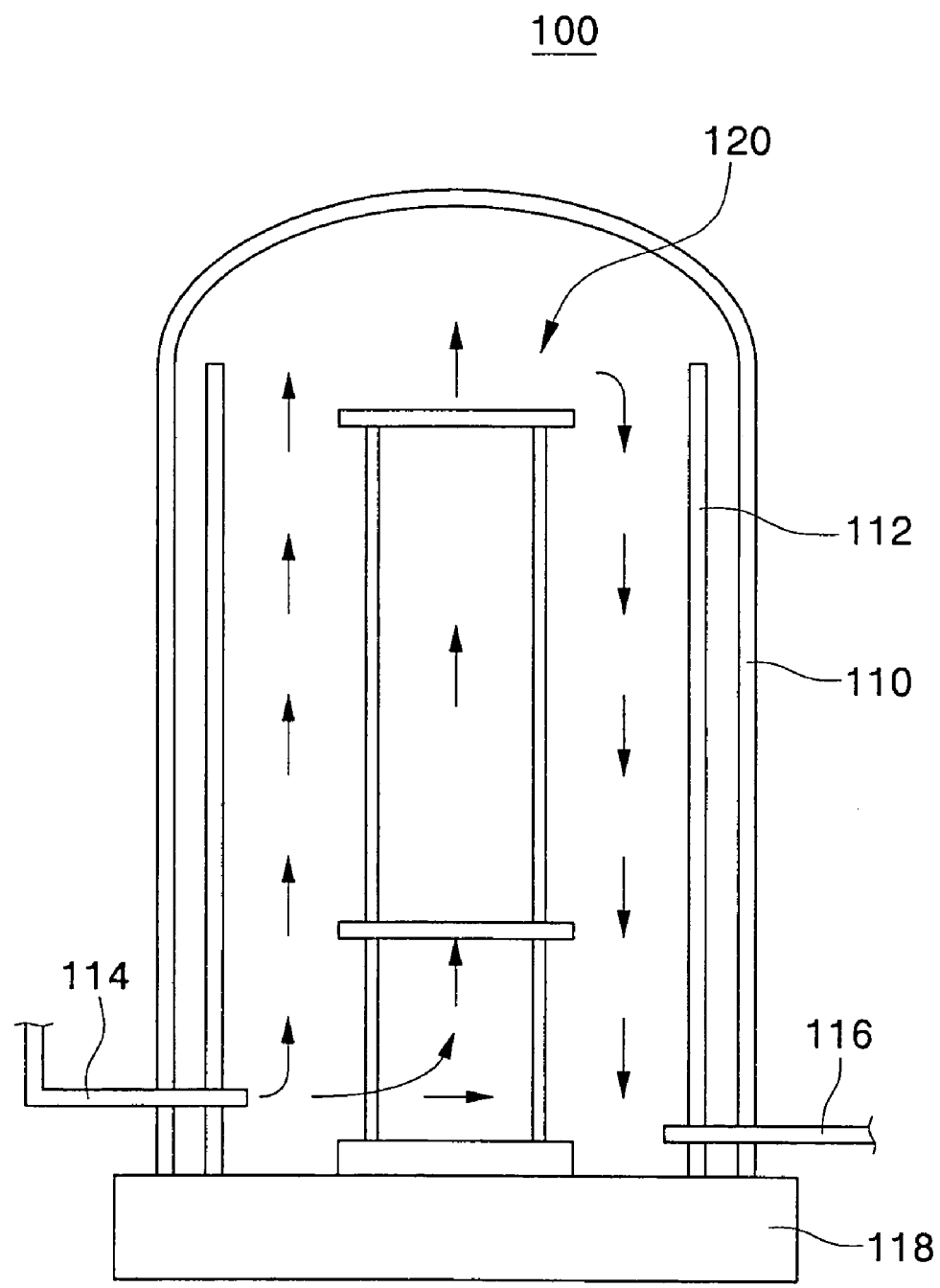
FIG. 1 is a schematic cross-sectional view of a conventional diffusion furnace of semiconductor manufacturing equipment.

The present invention will now be described more fully hereinafter with reference to the accompanying drawings. Like reference numerals designate like elements throughout the drawings.

Figure 3:
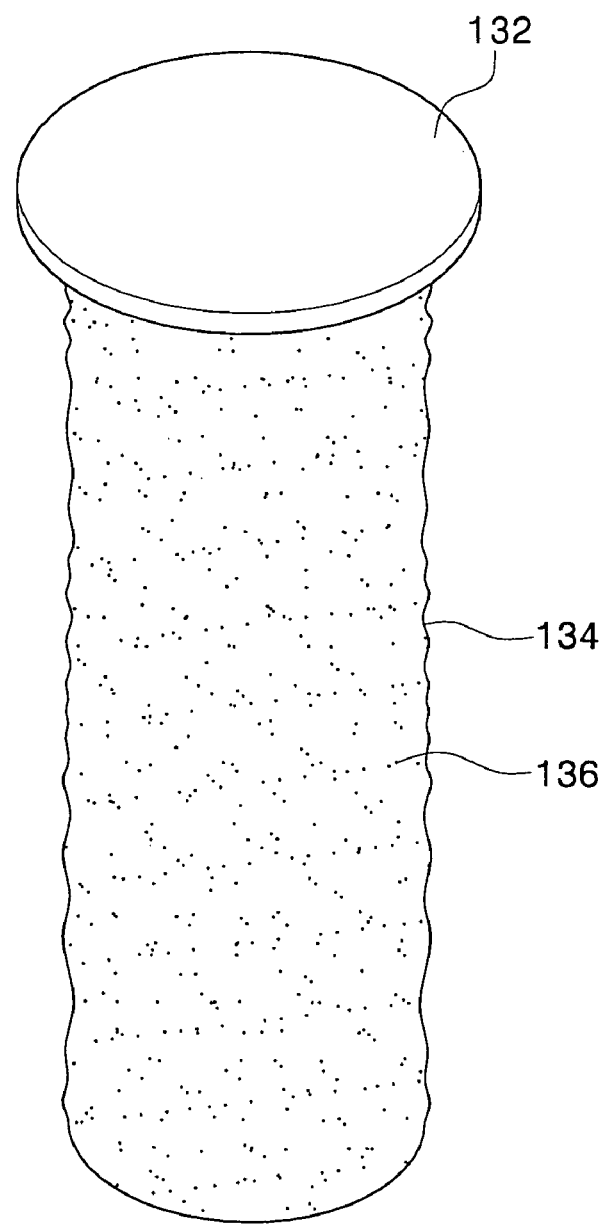
FIG. 3 is a perspective view of a first embodiment of an auxiliary cleaner for use in cleaning a diffusion furnace in accordance with the present invention.

FIG. 3 illustrates a first embodiment of an auxiliary cleaner 130 in accordance with the present invention. The auxiliary cleaner 130 includes a cylindrical body 134 having an outer diameter smaller than the inner diameter of an inner tube of the diffusion furnace with which it is used, and a flange 132 disposed at an upper end of the body 134 over the cavity 138 defined in the body 134. The flange 132 is located at an upper part of the diffusion furnace when the flange 132 is installed in the inner tube of the diffusion furnace, and has a diameter similar to the inner diameter of the inner tube so as to lie adjacent one end of the inner tube of the diffusion furnace when the auxiliary cleaner 130 is installed in the furnace. The flange may have a diameter equal to the inner diameter of the inner tube, as shown in dashed lines in FIG. 4. Accordingly, the auxiliary cleaner 130 will remain upright during the cleaning operation. Also, the flange 132 of the auxiliary cleaner 130 will prevent the cleaning $ClF_3$ gas from passing out of the top of the inner tube. As a result, the cleaning process can be performed using only a small amount of the $ClF_3$ gas.

In addition, the body 134 has a plurality of projections 136 irregularly disposed on the outer surface thereof. The projections 136 thus create turbulence in the cleaning $ClF_3$ gas flowing along the body 134. In addition, the auxiliary cleaner is lightweight and economical to manufacture because the body 134 thereof is cylindrical.

Figure 2:
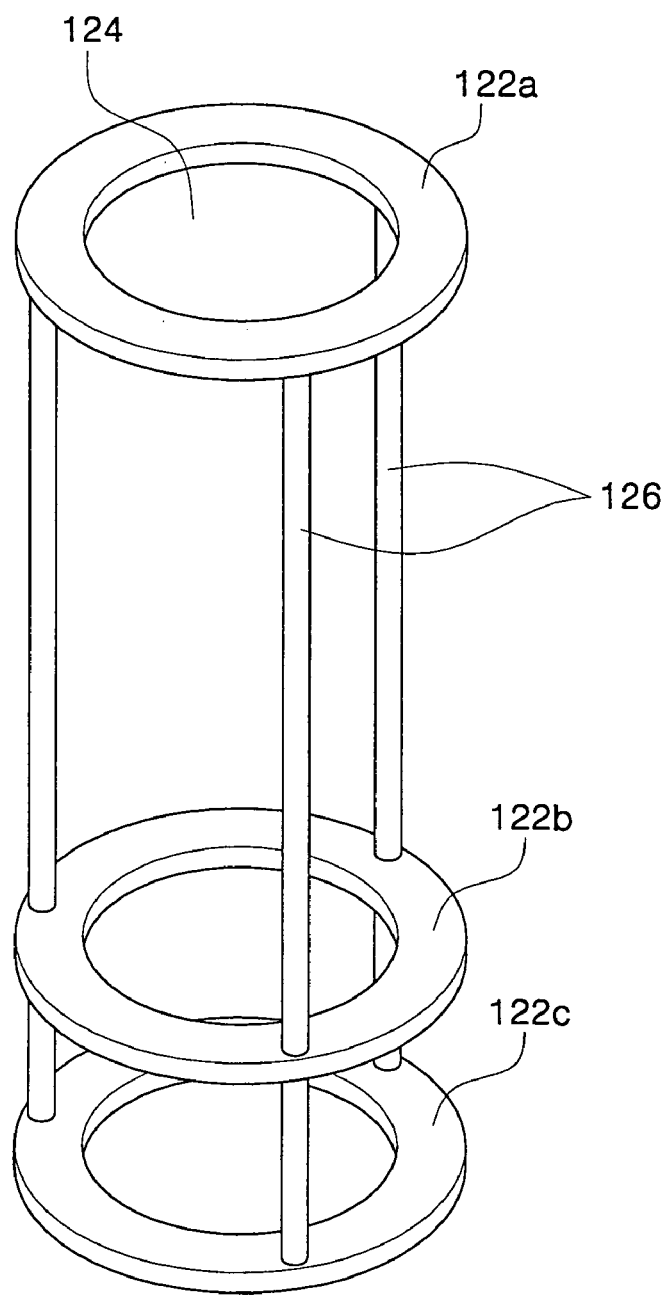
FIG. 2 is a perspective view of the wafer boat shown in FIG. 1.
Figure 4:
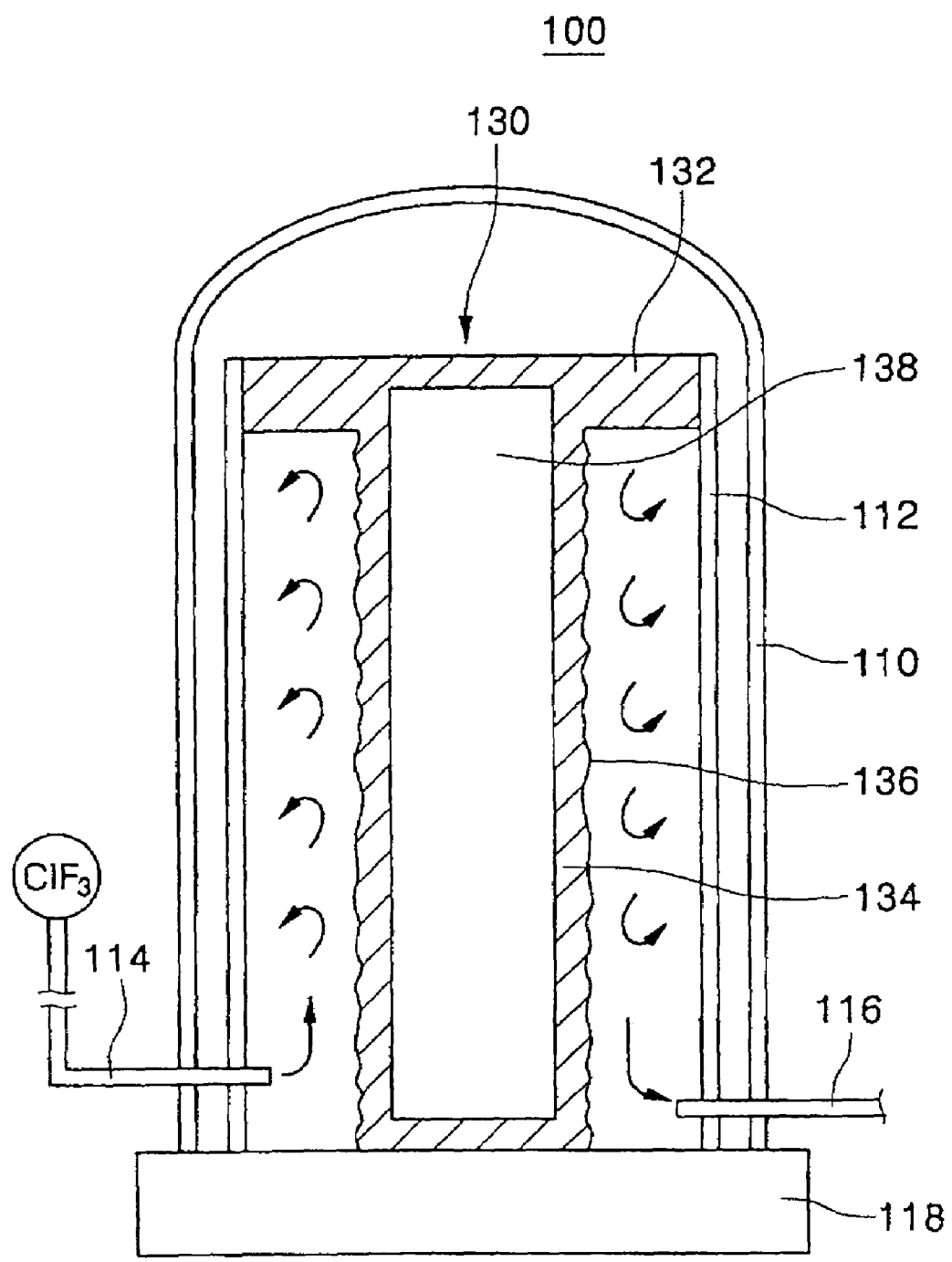
FIG. 4 is a schematic cross-sectional view of a diffusion furnace equipped with the cleaner shown in FIG. 3.

FIG. 4 illustrates a process of cleaning a diffusion furnace 100 using the auxiliary cleaner 130. First, the wafer boat (similar to that shown in FIG. 2) is removed from the furnace. The auxiliary cleaner 130 is then installed at the center of the inner tube 112 with the flange 132 thereof located at an upper part of the diffusion furnace 100. In this state, the cleaning $ClF_3$ gas is supplied through a gas supply pipe 114 located at a lower part of the diffusion furnace 100, and the supplied gas flows along a path formed between the inner wall of the inner tube 112 and the body 134 of the auxiliary cleaner 130. At this time, the gas flows in a turbulent state due to the projections 136 at the outer surface of the body 134.

Therefore, the cleaning gas remains in contact with the inner wall of the inner tube 112 for a prolonged period of time to thereby facilitate an efficient cleaning of the inner tube 112. In addition, most of the cleaning gas is discharged after flowing over the inner tube and around the auxiliary cleaner because the upper end of the inner tube 112 is substantially closed off by the flange 132. Still further, only a small amount of gas needs to be injected because the body 134 of the auxiliary cleaner occupies more space, i.e., displaces a greater volume, than did the wafer boat when the wafer boat was situated in the furnace. As a result, a relatively small amount of the cleaning gas is consumed during the cleaning process.

Figure 5:
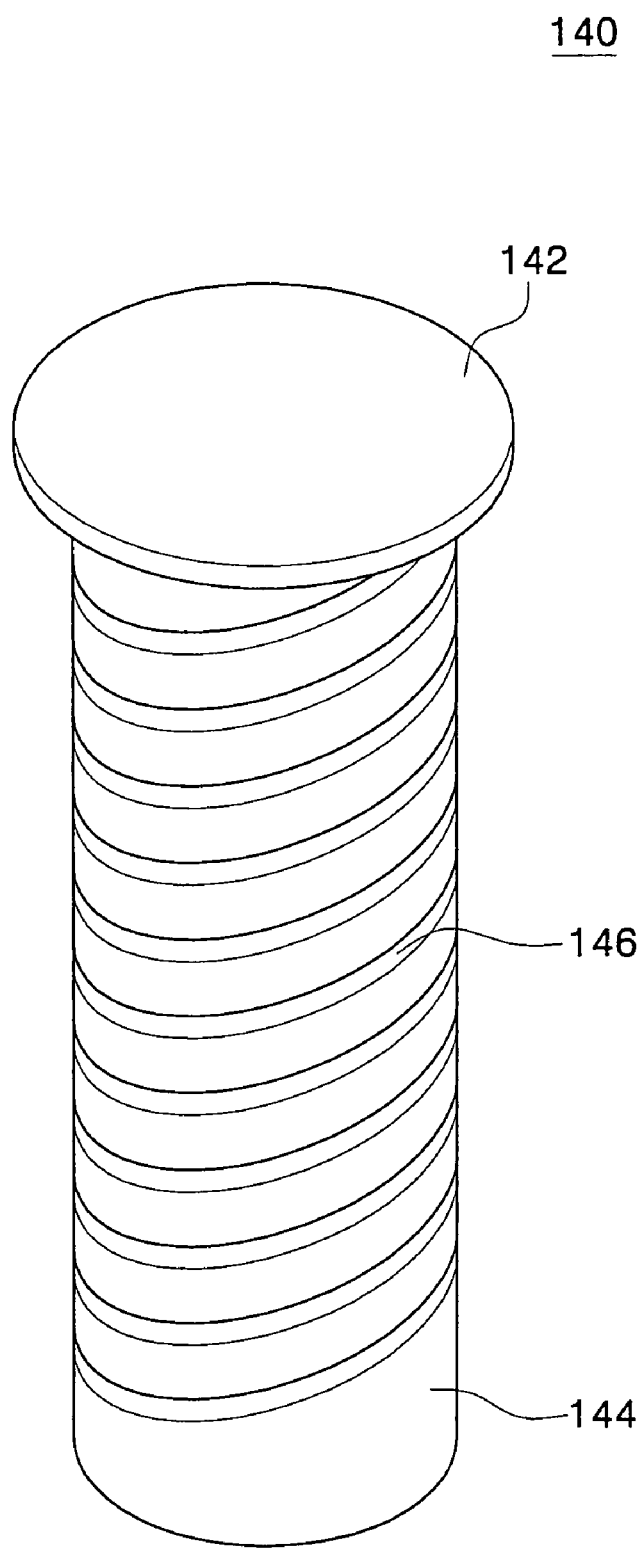
FIG. 5 is a perspective view of a second embodiment of an auxiliary cleaner for use in cleaning a diffusion furnace in accordance with the present invention.

FIG. 5 is a perspective view of a second embodiment of an auxiliary cleaner 140 in accordance with the present invention. The second embodiment 140 is similar to the first embodiment in that the second embodiment includes a flange 142, a cylindrical body 144 defining a cavity therein and undulations in a majority of its outer surface. However, the body 144 of the auxiliary cleaner 140 has a helical groove 146, i.e., a thread, in the outer surface thereof, to provide such undulations. When the cleaning gas is injected into the diffusion furnace, the injected gas flows around and around the cylindrical body 144 within the helical groove 146. As a result, centrifugal force is applied to the gas, whereby the gas becomes turbulent and collides forcefully with the inner wall of the inner tube. Thus, the effectiveness of the cleaning process is enhanced.

As can be seen from the foregoing, the present invention is capable of providing an excellent cleaning effect using a smaller amount of $ClF_3$ gas than the prior art.

Finally, although the present invention has been described above in connection with the preferred embodiments thereof, the present invention is not so limited. Rather, various changes in form and details may be made to the preferred embodiments without departing from the true spirit and scope of the present invention as set forth in the following claims.

What is claimed is:

1. The combination of a diffusion furnace of semiconductor manufacturing equipment, a wafer boat positionable in the diffusion furnace and configured to support a wafer within the diffusion furnace so that the wafer can be processed in the diffusion furnace, and an auxiliary cleaner mountable in the diffusion furnace in place of the wafer boat for use in cleaning the diffusion furnace, wherein the diffusion furnace has a furnace body that includes an inner tube, and a cleaning gas injection system operative to inject cleaning gas into the inner tube, and the auxiliary cleaner has a main body sized to fit within the inner tube as spaced apart from an inner wall surface of the inner tube, the main body displacing a volume greater than that displaced by the wafer boat when the auxiliary cleaner is mounted in the diffusion furnace.

2. The combination of a diffusion furnace and an auxiliary cleaner according to claim 1, wherein the main body of the auxiliary cleaner is cylindrical.

3. The combination of a diffusion furnace and an auxiliary cleaner according to claim 2, wherein the main body of the auxiliary cleaner is hollow.

4. The combination of a diffusion furnace and an auxiliary cleaner according to claim 2, wherein the auxiliary cleaner has a flange extending radially outwardly from one end of the main body.

5. The combination of a diffusion furnace and an auxiliary cleaner according to claim 4, wherein the flange has an outer diameter equal to the inner diameter of the inner tube of the diffusion furnace.

6. The combination of a diffusion furnace and an auxiliary cleaner according to claim 1, wherein the main body of the auxiliary cleaner has a plurality of projections protruding at the outer surface thereof.

7. The combination of a diffusion furnace and an auxiliary cleaner according to claim 1, wherein the main body of the auxiliary cleaner has a groove in the outer surface thereof.

8. The combination of a diffusion furnace and an auxiliary cleaner according to claim 7, wherein the groove extends helically along the outer surface of the main body of the auxiliary cleaner.

9. An auxiliary cleaner for use in enhancing the cleaning of the interior of a diffusion furnace of semiconductor manufacturing equipment using cleaning gas, said auxiliary cleaner comprising a cylindrical body sized to fit within the diffusion furnace as spaced from an interior wall surface thereof, and said cylindrical body having undulations in a majority of its outer surface to thereby create turbulence in the cleaning gas used to clean the diffusion furnace.

10. The auxiliary cleaner according to claim 9, wherein the cylindrical body has a plurality of projections protruding at the outer surface thereof and which projections create the undulations in the outer surface.

11. The auxiliary cleaner according to claim 9, wherein the cylindrical body has a groove in the outer surface thereof and which the groove creates the undulations in the outer surface.

12. The auxiliary cleaner according to claim 11, wherein the groove extends helically along the outer surface of the cylindrical body.

13. The auxiliary cleaner according to claim 9, wherein the cylindrical body is hollow.

14. The auxiliary cleaner according to claim 9, further comprising a flange disposed at and extending radially outwardly of one end of the cylindrical body.

15. A method of cleaning a diffusion furnace of semiconductor manufacturing equipment, said method comprising:
  providing an an auxiliary cleaner having a cylindrical body;
  inserting the auxiliary cleaner into an inner tube of the diffusion furnace with the cylindrical body occupying the axial center of the interior tube of the diffusion furnace as spaced from an inner wall surface of the inner tube; and
  subsequently injecting a cleaning gas into the inner tube, whereby the cylindrical body confines the gas to a peripheral region of the interior of the inner tube adjacent the inner wall surface.

16. The method according to claim 15, wherein the auxiliary cleaner provided has a flange protruding radially outwardly from one end of the cylindrical body, and the auxiliary cleaner is set in the inner tube with the flange thereof disposed adjacent one end of the inner wall surface.

17. The method according to claim 15, wherein the auxiliary cleaner provided has a flange protruding radially outwardly from one end of the cylindrical body, and the auxiliary cleaner is set in the inner tube with the flange in contact with an end of the inner wall surface.

18. The method according to claim 15, wherein the cylindrical body of the auxiliary cleaner provided has undulations in the outer surface thereof to thereby create turbulence in the cleaning gas injected into the furnace.

19. The combination of a diffusion furnace of semiconductor manufacturing equipment, a wafer boat positionable in the diffusion furnace and configured to support a wafer within the diffusion furnace so that the wafer can be processed in the diffusion furnace, and an auxiliary cleaner mountable in the diffusion furnace in place of the wafer boat for use in cleaning the diffusion furnace, wherein the diffusion furnace has a furnace body that includes an inner tube, and a cleaning gas injection system comprising a source of cleaning gas, and a supply pipe connected to the source of cleaning gas and terminating at a location within the inner tube of the diffusion furnace such that cleaning gas is injected into the diffusion furnace at said location, and the auxiliary cleaner is discrete from the cleaning gas injection system and has a main body sized to fit within the inner tube as spaced from said location at which the cleaning gas is injected into the diffusion furnace.

20. The combination of a diffusion furnace and an auxiliary cleaner according to claim 19, wherein the main body of the auxiliary cleaner is cylindrical, whereby the supply pipe of the cleaning gas injection system terminates at a location between the inner tube of the diffusion furnace and the cylindrical main body when the auxiliary cleaner is mounted in the diffusion furnace.

* * * * *